United States Patent
Kwon (10) Patent No.: US 8,847,486 B2
(45) Date of Patent: Sep. 30, 2014

(54) RESIN MATERIAL AND LIGHT EMITTING DEVICE PACKAGE THAT INCLUDES THE RESIN MATERIAL

(71) Applicant: Jina Kwon Kwon, Seoul (KR)

(72) Inventor: Jina Kwon Kwon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/736,346

(22) Filed: Jan. 8, 2013

(65) Prior Publication Data
US 2013/0182408 A1    Jul. 18, 2013

(30) Foreign Application Priority Data
Jan. 13, 2012   (KR) .................. 10-2012-0004451

(51) Int. Cl.
F21V 9/16      (2006.01)
F21V 21/00     (2006.01)
H01L 33/56     (2010.01)
C08L 83/04     (2006.01)
H01L 33/48     (2010.01)

(52) U.S. Cl.
CPC .............. *F21V 21/00* (2013.01); *C08L 83/04* (2013.01); *H01L 33/56* (2013.01); *H01L 2924/0002* (2013.01); *H01L 33/486* (2013.01); *F21V 9/16* (2013.01); *H01L 2933/005* (2013.01)

USPC .......................... 313/512; 313/507; 362/84

(58) Field of Classification Search
USPC ..................... 257/40, 98; 313/512; 362/84
See application file for complete search history.

(56) References Cited

U.S. PATENT DOCUMENTS

| | | | |
|---|---|---|---|
| 7,705,366 B2 * | 4/2010 | Seo et al. | 257/99 |
| 7,888,441 B2 * | 2/2011 | Schwab | 526/240 |
| 2008/0220266 A1 * | 9/2008 | Murai et al. | 428/447 |
| 2009/0289275 A1 * | 11/2009 | Hayashi | 257/99 |

* cited by examiner

*Primary Examiner* — Tracie Y Green
(74) *Attorney, Agent, or Firm* — KED & Associates, LLP (57) ABSTRACT

A light emitting device package is disclosed. The light emitting device package includes a light emitting device, a body that includes first and second lead frames electrically connected to the light emitting device and has a cavity disposed on the first and second lead frames, and a resin material that fills the cavity and includes a main material having a vinyl group (—CH=CH$_2$) and a sub-material having a plurality of silane groups (Si—H). In the resin material, the vinyl groups and the silane groups are cross-linked to each other by curing. According to an FT-IR signal, an optical density (absorbance) of silane groups (Si—H) not reacted with the vinyl groups (—CH=CH$_2$) may be in the range of 0.0002 to 0.01 (arb. unit).

5 Claims, 5 Drawing Sheets

RESIN MATERIAL AND LIGHT EMITTING DEVICE PACKAGE THAT INCLUDES THE RESIN MATERIAL

CROSS-REFERENCE TO RELATED APPLICATION

This application claims the priority benefit of Korean Patent Application No. 10-2012-0004451, filed on Jan. 13, 2012 in the Korean Intellectual Property Office, the disclosure of which is incorporated herein by reference.

BACKGROUND

1. Field

Embodiments relate to a light emitting device package.

2. Description of the Related Art

A light emitting diode (LED), as a light emitting device, converts an electrical signal into infrared light, visible light, or other forms of light using the properties of a compound semiconductor. LEDs are used in electric home appliances, remote controllers, electric bulletin boards, displays, various kinds of automated equipment, etc. The application range of LEDs continues to expand.

Generally, a miniaturized LED is of a surface mount device type so that the LED is directly mounted on a printed circuit board (PCB). As a result, an LED lamp, used as a display device, has been developed to have a surface mount device type structure. The surface mount device may replace an existing simple lighting lamp. The surface mount device may be applied to various colored lighting displays, text displays, image displays, etc.

A light emitting device package including a light emitting device includes a body that includes a lead frame electrically connected to the light emitting device and has a cavity and formed on the lead frame and a cross-linked resin material that is disposed in the cavity.

However, corrosion of the surface of the lead frame caused by foreign materials introduced while the resin material shrinks and swells occurs in the light emitting device package during emission of the light emitting device.

Therefore, recently, research into blocking inflow of foreign materials into the resin material or discharging the foreign materials from the resin material to the outside in the light emitting device package has been conducted.

SUMMARY

Embodiments provide a light emitting device package capable of preventing foreign materials from being introduced by enhancing a binding force between a main material including a vinyl group (—CH=CH$_2$) and a sub-material including a plurality of silane groups (Si—H).

The light emitting device package includes a light emitting device, a body that includes first and second lead frames electrically connected to the light emitting device and has a cavity disposed on the first and second lead frames, and a resin material that fills the cavity and includes a main material having a vinyl group (—CH=CH$_2$) and a sub-material having a plurality of silane groups (Si—H). In the resin material, the vinyl groups and the silane groups are cross-linked to each other by curing. According to an FT-IR signal, an optical density (absorbance) of the silane groups (Si—H) not reacted with the vinyl groups (—CH=CH$_2$) may be in the range of 0.0002 to 0.01 (arb. unit).

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Reference will now be made in detail to embodiments, examples of which are illustrated in the accompanying drawings. Wherever possible, the same reference numbers will be used throughout the drawings to refer to the same or like parts.

Prior to description of the embodiments, it will be understood that, when an element is referred to as being formed "on" or "under" another element, it can be directly "on" or "under" the other element or be indirectly formed with intervening elements therebetween. In addition, when an element is referred to as being formed "on or under", the term encompasses both an orientation of above and below.

In the drawings, the thickness or size of each layer is exaggerated, omitted, or schematically illustrated for convenience of description and clarity. Thus, the size of each constituent element does not entirely reflect the actual size thereof.

Angles or directions used to describe the structures of light emitting device packages according to embodiments are based on those shown in the drawings. Unless there is, in the specification, no definition of a reference point to describe angular positional relations in the structures of the light emitting device packages, the associated drawings may be referred to.

Figure 1:
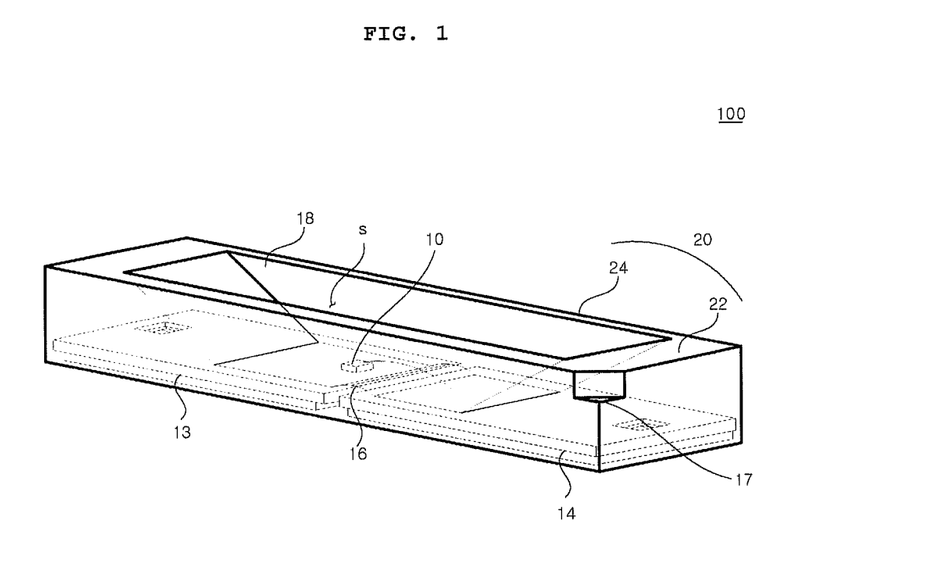
FIG. 1 is a perspective view illustrating a light emitting device package according to an embodiment.

FIG. 1 is a perspective view illustrating a light emitting device package according to an embodiment.

FIG. 1 is a partial transmissive perspective view of the light emitting device package. According to the embodiment, the light emitting device package is of a top view type. However, a side view type light emitting device package may also be used without limitation.

Referring to FIG. 1, a light emitting device package 100 includes a light emitting device 10 and a package body 20 in which the light emitting device 10 is disposed.

The package body 20 may include a first partition wall 22 disposed in a first direction (not shown) and a second partition wall 24 disposed in a second direction (not shown) intersecting the first direction. The first and second partition walls 22 and 24 may be integrally formed. The package body 20 may be formed by injection molding or etching; however, the disclosure is not limited thereto.

That is, the first and second partition walls 22 and 24 may be formed of at least one selected from the group consisting of a resin material such as polyphthalamide (PPA), silicon (Si), aluminum (Al), aluminum nitride (AlN), AlOx, liquid crystal polymer, photo sensitive glass (PSG), polyamide9T (PA9T), syndiotactic polystyrene (SPS), a metallic material, sapphire ($Al_2O_3$), beryllium oxide (BeO), ceramic and a printed circuit board (PCB).

Upper surfaces of the first and second partition walls 22 and 24 may be formed in various shapes, such as a triangular shape, a quadrangular shape, a polygonal shape, and a circular shape, based on use or design of the light emitting device 10, but the disclosure is not limited thereto.

In addition, the first and second partition walls 22 and 24 may form a cavity s in which the light emitting device 10 is disposed. The cavity s may be formed in a cup shape or a concave container shape in section. The inner side surface of the first and second partition walls 22 and 24 defining the cavity s may be inclined downward.

In addition, the cavity s may be formed in various shapes, such as a triangular shape, a quadrangular shape, a polygonal shape, and a circular shape in plane, but the disclosure is not limited thereto.

First and second lead frames 13 and 14 may be disposed at the lower surface of the package body 20. The first and second lead frames 13 and 14 may be formed of at least one metal selected from the group consisting of titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe) or an alloy thereof.

In addition, the first and second lead frames 13 and 14 may have a single layer or multi layer structure, but the disclosure is not limited thereto.

The inner side surfaces of the first and second partition walls 22 and 24 may be formed at a predetermined inclination angle with respect to one of the first and second lead frames 13 and 14. A reflection angle of light emitted from the light emitting device 10 may vary according to the inclination angle of the inner side surface of the first and second partition walls 22 and 24, thereby adjusting an orientation angle of light emitted outward. As the orientation angle of light decreases, concentration of light outwardly emitted from the light emitting device 10 increases. On the other hand, as the orientation angle of light increases, concentration of light emitted from the light emitting device 10 decreases.

The inner side surface of the package body 20 may have a plurality of inclination angles, but the disclosure is not limited thereto.

The first and second lead frames 13 and 14 may be electrically connected to the light emitting device 10 and connected to an anode (positive electrode) and a cathode (negative electrode) of an external power source (not shown) to supply power to the light emitting device 10.

In the embodiment, the light emitting device 10 is mounted on the first lead frame 13, and the second lead frame 14 is spaced apart from the first lead frame 13. The light emitting device 10 is connected to the first lead frame 13 by die bonding and connected to the second lead frame 14 by wire bonding using a wire (not shown). As a result, power is supplied to the light emitting device 10 via the first and second lead frames 13 and 14.

In this regard, the light emitting device 10 may be bonded to the first lead frame 13 and the second lead frame 14 with different polarities.

Also, the light emitting device 10 may be connected to the first and second lead frames 13 and 14 by wire bonding or die bonding, but the connection method is not limited thereto.

In the embodiment, the light emitting device 10 is disposed on the first lead frame 13, but the disclosure is not limited thereto.

Also, the light emitting device 10 may be connected to the first lead frame 13 by an adhesive member (not shown).

In this regard, in order to prevent occurrence of short circuit between the first and second lead frames 13 and 14, an insulating dam 16 may be formed between the first and second lead frames 13 and 14.

In the embodiment, the upper portion of the insulating dam 16 may be formed in a semicircular shape, but the disclosure is not limited thereto.

A cathode mark 17 may be formed at the package body 20. The cathode mark 17 may be used to distinguish between polarities of the light emitting device 10, i.e., polarities of the first and second lead frames 13 and 14 to prevent confusion when the first and second lead frames 13 and 14 are electrically connected.

The light emitting device 10 may be a light emitting diode. For example, the light emitting diode may be a colored light emitting diode emitting light such as red, green, blue, and white light or an ultraviolet (UV) light emitting diode emitting UV light, but the disclosure is not limited thereto. In addition, a plurality of light emitting devices 10 may be mounted on the first lead frame 13, and at least one light emitting device 10 may be mounted on the first and second lead frames 13 and 14. However, the number and mounted positions of the light emitting device 10 are not limited thereto.

The package body 20 may include a resin material 18 filling the cavity s. That is, the resin material 18 may be formed to have a double or triple mold structure, but the disclosure is not limited thereto.

The resin material 18 may also be formed in a film shape and may include at least one of a fluorescent substance, a light diffusion material, and a light dispersion material. Also, a light transmitting material which does not include a fluorescent substance, a light diffusion material, and a light dispersion material may also be used without limitation.

Figure 2:
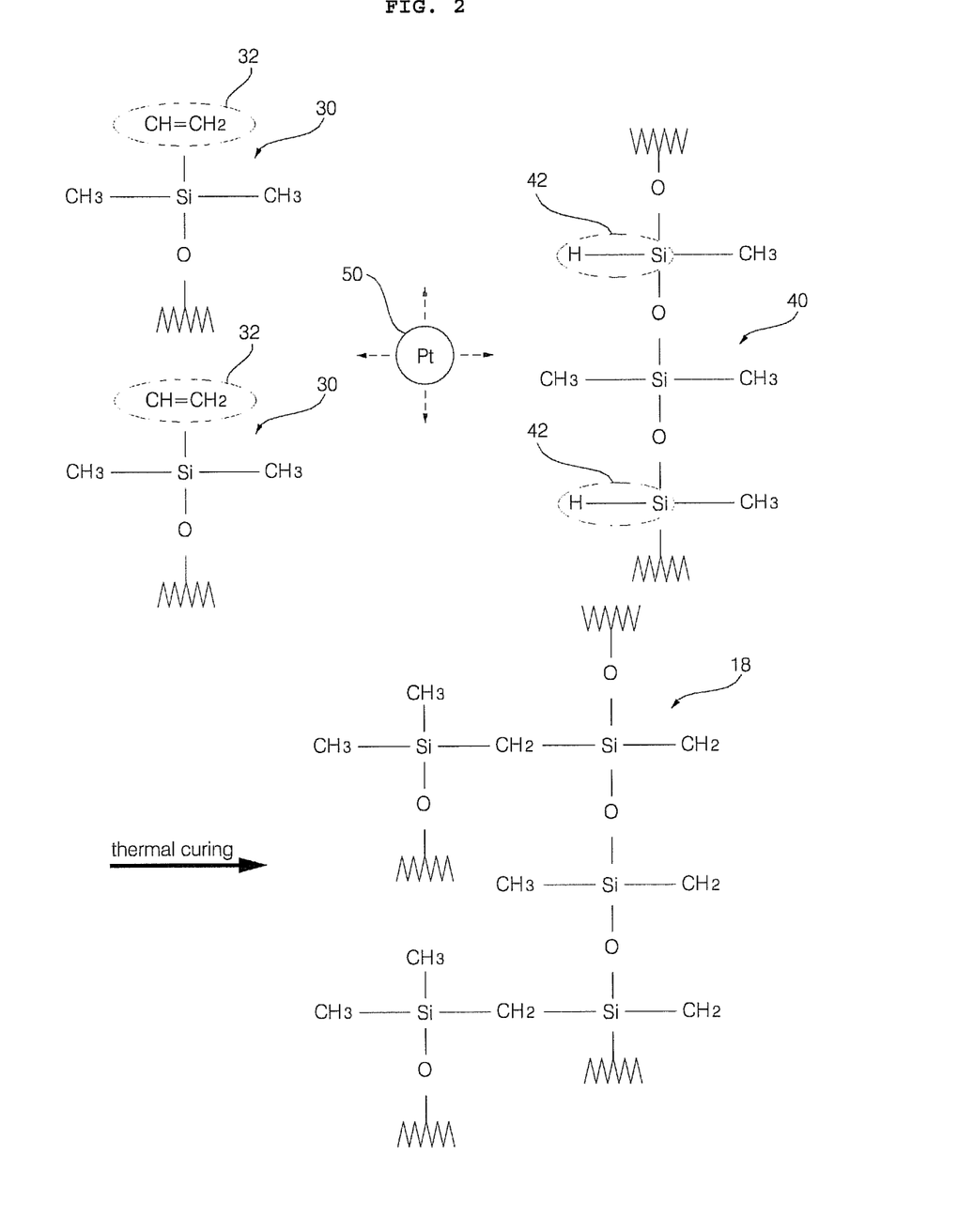
FIG. 2 is a diagram showing change of a chemical structure of a resin material shown in FIG. 1 before and after thermal curing.
Figure 3:
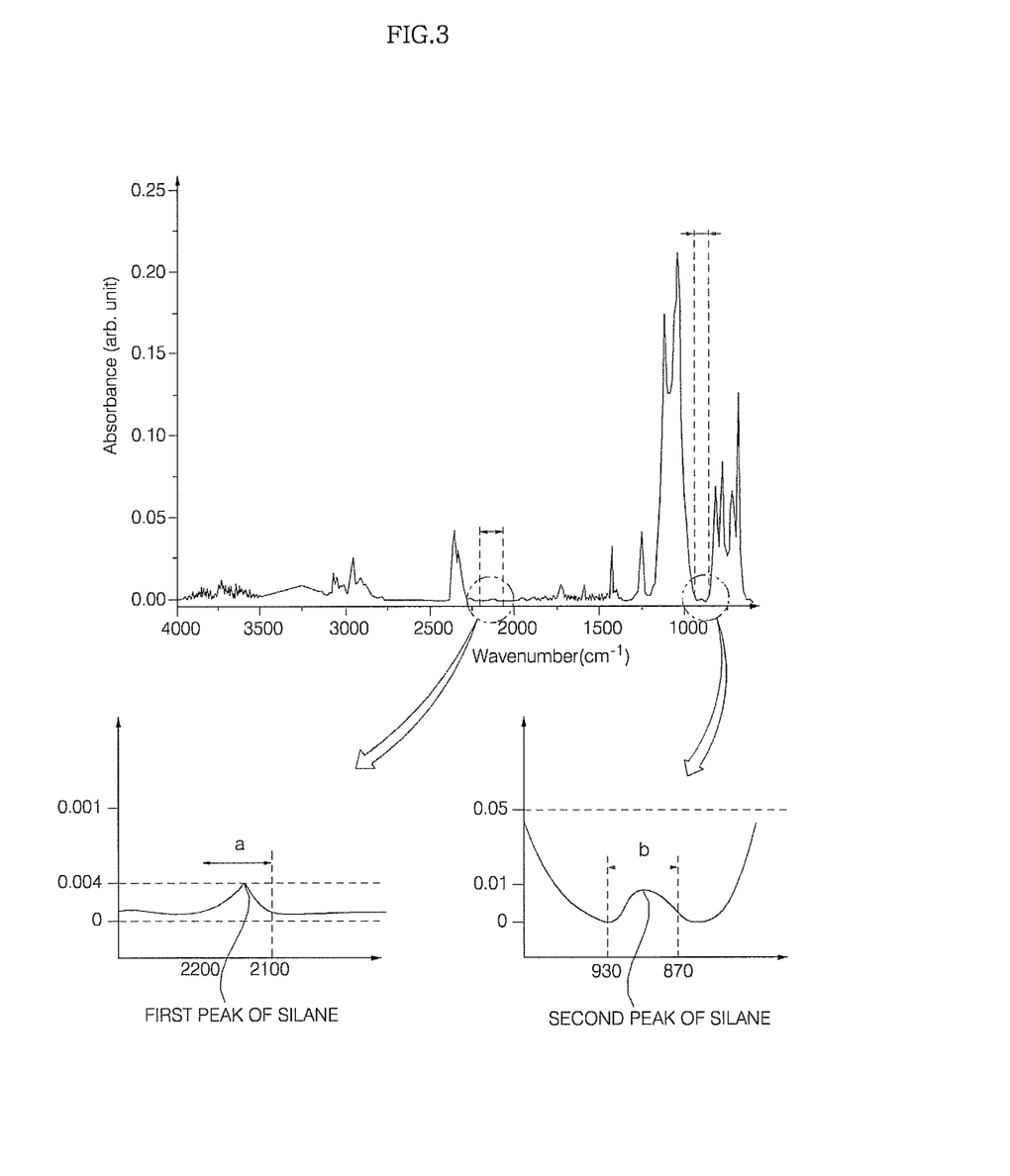
FIG. 3 is a graph illustrating a waveform of an FT-IR signal of the resin material shown in FIG. 1.

FIG. 2 is a diagram showing change of a chemical structure of a resin material shown in FIG. 1 before and after thermal curing. FIG. 3 is a graph illustrating a waveform of an FT-IR signal of the resin material shown in FIG. 1.

Referring to FIGS. 2 and 3, the resin material 18 may be formed of a silicon material.

In the embodiment, an organic polysiloxane including Si is described as the resin material 18. However, any polysiloxane that does not include Si or includes an element other than Si may also be used, but the disclosure is not limited thereto.

Before thermal curing, the resin material 18 may include a main material 30 including a vinyl group 32, a sub-material 40 including a plurality of silane groups 42, and a catalyst 50 promoting bonding between the vinyl groups 32 and the silane groups 42.

In this regard, the catalyst 50 may include another material, such as platinum (Pt), promoting bonding between the vinyl groups 32 and the silane groups 42, but the disclosure is not limited thereto.

In this regard, the main material 30 may have a vinyl group 32 and may include $(CH_3)2HSiO(CHCH_2)$ as a repeat unit, and the sub-material 40 may have a silane group 42 and may include $(CH_3)SiO(SiH)$ as a repeat unit.

In addition, the content of silane group 42 contained in the sub-material 40 may be in the range of 0.7 to 0.9 times that of the vinyl group 32. Accordingly, as the vinyl group 32 and the silane group 42 are cross-linked to each other during thermal curing of the resin material 18, the content of unreacted silane group 42 may be reduced. Thus, hardness of the cross-linked resin material 18 may be increased. The above-mentioned content may include any one of mass ratio, molar ratio, and weight ratio.

After thermal curing, all of the silane groups 42 may be bonded to the vinyl groups 32 or a very small amount of unreacted silane groups 42 may be remained since the content of the silane group 42 is less than that of the vinyl group 32.

In this regard, FIG. 3 illustrates infrared spectra obtained using Fourier transform infrared spectroscopy (FT-IR), one form of infrared absorption spectroscopy. Hereinafter, the infrared spectrum is referred to as an FT-IR signal.

In this regard, as shown in FIG. 3, the FT-IR signal may be defined by optical density (absorbance) of the silane group 42 that is not reacted with the vinyl group 32 with respect to wavenumber ($cm^{-1}$).

The FT-IR signal shows first and second absorption peaks of the silane group 42 according to stretching and bending vibrations of the unreacted silane group 42.

The stretching vibration is a vibration occurring when the distance between Si and H of the silane group 42 increases and decreases, and the bending vibration is a vibration occurring when the positions of Si and H of the silane 42 group deviate from a binding axis thereof.

According to the FT-IR signal as shown in FIG. 3, the optical density of the silane group 42 may be in the range of 0.0002 to 0.004 (arb. unit) in a first wavenumber range a and the optical density of the silane group 42 may be in the range of 0.005 to 0.01 (arb. unit) in a second wavenumber range b.

Thus, the optical density of unreacted silane groups 42 may be in the range of 0.0002 to 0.01 (arb. unit), which is close to 0 (arb. unit).

In this regard, if the optical density of the unreacted silane group 42 is greater than 0.01 (arb. unit), there is a high possibility of binding between silane 42 and foreign materials, such as PVC from electronic components or wire and phthalate generated in an external device, resulting in increase in corrosion on the surfaces of the first and second lead frames 13 and 14.

In this regard, the first wavenumber range a may be in the range of 2100 to 2200 $cm^{-1}$, and the second wavenumber range b may be in the range of 870 to 930 $cm^{-1}$.

As such, when the optical density of the unreacted silane group 42 is close to 0 (arb. unit), the silane group 42 may not bind to foreign materials, and the degree of curing of the resin material 18 may be increased. Thus, reliability against heat generated in the light emitting device 10 may be improved.

Figure 4:
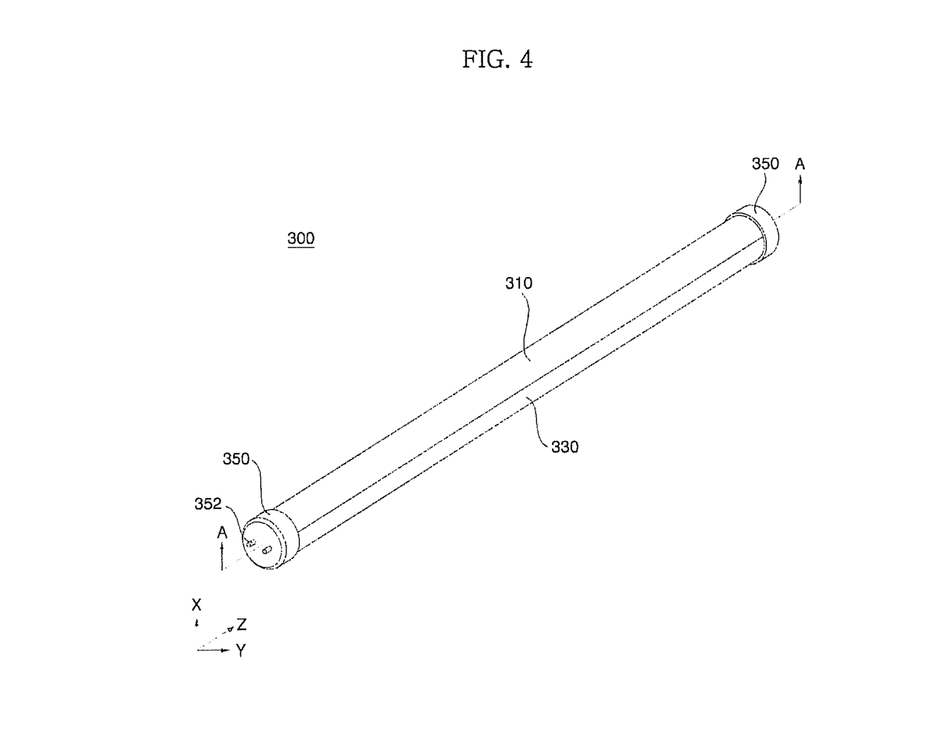
FIG. 4 is a perspective view illustrating a lighting apparatus including a light emitting device package according to an embodiment.
Figure 5:
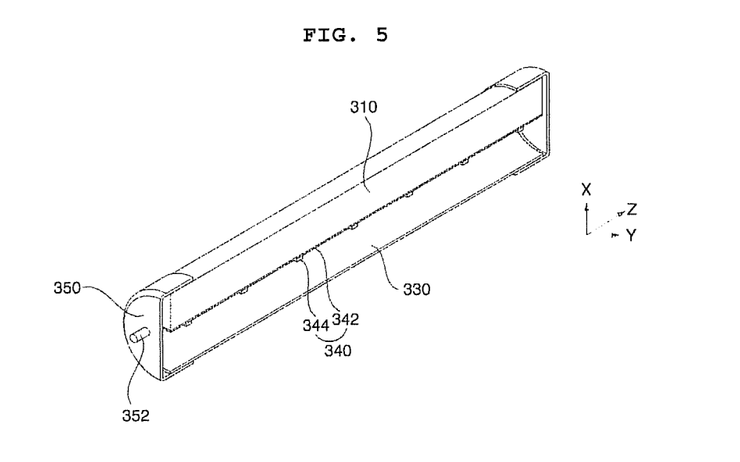
FIG. 5 is a cross-sectional view taken along line A-A' of the lighting apparatus shown in FIG. 4.

FIG. 4 is a perspective view illustrating a lighting apparatus including a light emitting device package according to an embodiment. FIG. 5 is a cross-sectional view taken along line A-A' of the lighting apparatus shown in FIG. 4.

In the following description, the shape of the lighting apparatus 300 will be described in more detail based on a longitudinal direction Z of the lighting apparatus 300, a horizontal direction Y perpendicular to the longitudinal direction Z, and a height direction X perpendicular to both the longitudinal direction Z and the horizontal direction Y.

That is, FIG. 5 is a cross-sectional view taken along a Z-X plane of the lighting apparatus 300 of FIG. 4 and viewed in the horizontal direction Y.

Referring to FIGS. 4 and 5, the lighting apparatus 300 may include a body 310, a cover 330 coupled to the body 310, and end caps 350 located at both ends of the body 310.

A light emitting device module 340 is coupled to a lower surface of the body 310. The body 310 may be formed of a metallic material having excellent conductivity and heat radiation effects to outwardly dissipate heat generated from a light emitting device package 344 through an upper surface of the body 310.

In this regard, the light emitting device module 340 may include a light emitting device array (not shown) including the light emitting device package 344 and a printed circuit board (PCB) 342.

The light emitting device packages 344 emitting various colors may be mounted on the PCB 342 in multiple rows to constitute an array. The light emitting device packages 344 may be mounted at the same interval or at various intervals as required so as to adjust brightness of the lighting apparatus 300. A metal core PCB (MCPCB) or a PCB formed of an FR4 material may be used as the PCB 342.

The cover 330 may have a circular shape to surround the lower surface of the body 310, but the disclosure is not limited thereto.

The cover 330 protects the light emitting device module 340 from external foreign substances, and the like. The cover 330 may include light diffusion particles to achieve anti-glare effects and uniform emission of light generated from the light emitting device package 344. In addition, at least one of inner and outer surfaces of the cover 330 may be provided with a prism pattern. In addition, a fluorescent substance may be coated on at least one of the inner and outer surfaces of the cover 330.

Meanwhile, light generated from the light emitting device package 344 is outwardly emitted through the cover 330, the cover 330 should have high light transmittance and heat resistance sufficient to endure heat generated from the light emitting device package 344. Thus, the cover 330 may be formed of polyethylene terephthalate (PET), polycarbonate (PC), polymethyl methacrylate (PMMA), or the like.

The end caps 350 may be disposed at both ends of the body 310 and may be used to seal a power supply unit (not shown). Power pins 352 are respectively formed at the end caps 350. Thus, the lighting apparatus 300 according to the embodiment may be directly connected to a terminal, from which an existing fluorescent lamp has been removed, without an additional device.

Figure 6:
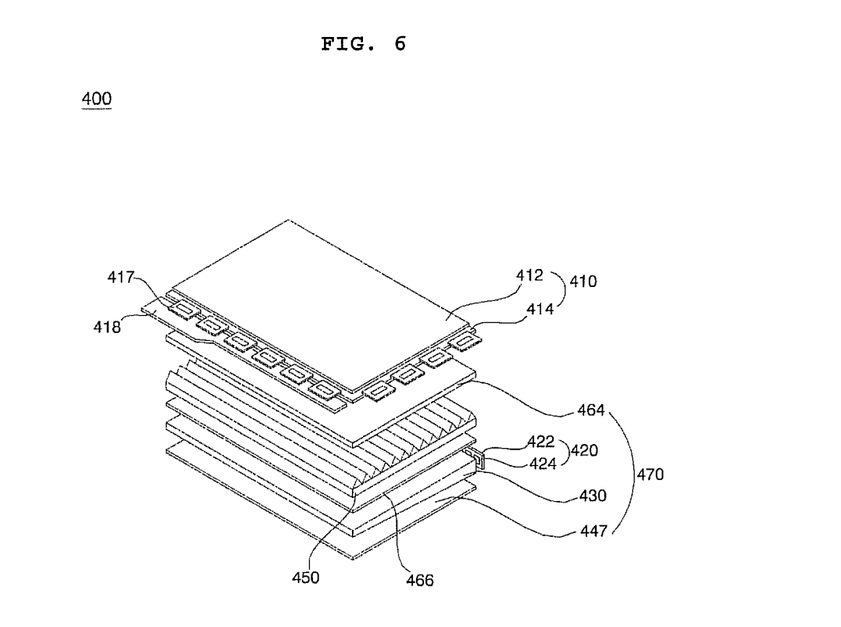
FIG. 6 is an exploded perspective view illustrating a liquid crystal display device including a light emitting device package according to a first embodiment.

FIG. 6 is an exploded perspective view illustrating a liquid crystal display device including a light emitting device package according to a first embodiment.

FIG. 6 illustrates an edge-light type liquid crystal display apparatus 400. The liquid crystal display apparatus 400 may include a liquid crystal display panel 410 and a backlight unit 470 to supply light to the liquid crystal display panel 410.

The liquid crystal display panel 410 may display an image using light supplied from the backlight unit 470. The liquid crystal display panel 410 may include a color filter substrate 412 and a thin film transistor substrate 414, which face each other with liquid crystals interposed therebetween.

The color filter substrate 412 may realize the color of an image displayed through the liquid crystal display panel 410.

The thin film transistor substrate 414 is electrically connected to a printed circuit board (PCB) 418, on which a plurality of circuit elements is mounted via a drive film 417. The thin film transistor substrate 414 may apply drive voltage provided by the PCB 418 to liquid crystals in response to a drive signal transmitted from the PCB 418.

The thin film transistor substrate 414 may include pixel electrodes and thin film transistors in the form of thin films formed on another substrate formed of a transparent material such as glass or plastic.

The backlight unit 470 includes a light emitting device module 420 emitting light, a light guide plate 430 changing light emitted from the light emitting device module 420 into planar light and providing the planar light to the liquid crystal display panel 410, a plurality of films 450, 464 and 466 enhancing uniformity in brightness distribution and vertical light incidence of light provided from the light guide plate 430, and a reflection sheet 447 reflecting light emitted rearwards from the light guide plate 430 toward the light guide plate 430.

The light emitting device module 420 may include a plurality of light emitting device packages 424 and a PCB 422 on which the plural light emitting device packages 424 are mounted to form an array.

In this regard, the light emitting device packages 424 may include first to third light emitting device packages (not shown) respectively emitting red light, green light, and blue light and disposed at a central region of the PCB 422 and a fourth light emitting device package (not shown) emitting white light and disposed at at least one of the left and right edge regions of the central region.

The fourth light emitting device package may be disposed at a side of the light guide plate 430 such that white light irradiated from the fourth light emitting device package is diffused.

This is because the white light emitted from the fourth light emitting device package may reduce color difference caused when white light is formed by mixing of the red light, green light, and blue light respectively emitted from the first to third light emitting device packages, distributed, and scattered.

Meanwhile, the backlight unit 470 may include a diffusion film 466 diffusing light emitted from the light guide plate 430 toward the liquid crystal display panel 410 and a prism film 450 condensing the diffused light, thereby improving vertical incidence of light. The backlight unit 470 may further include a protective film 464 to protect the prism film 450.

Figure 7:
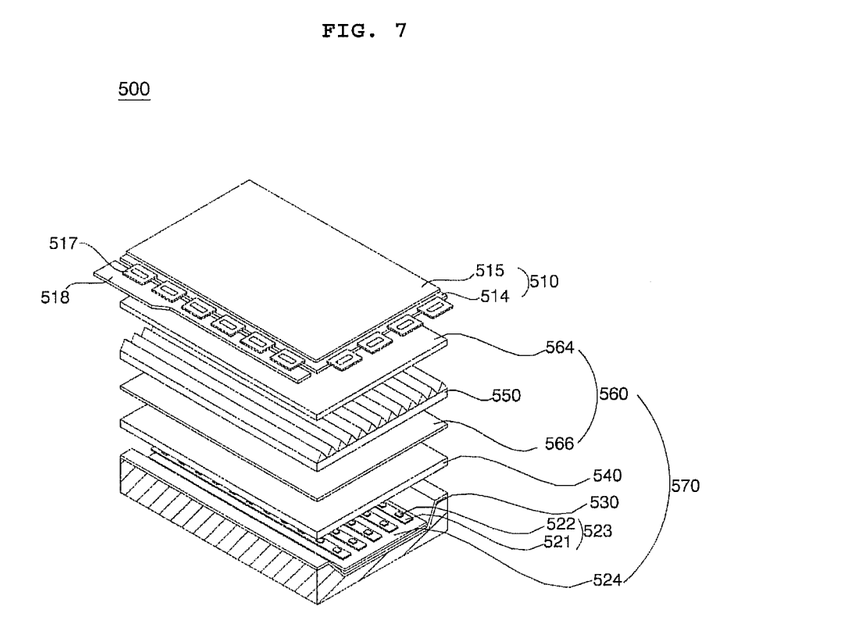
FIG. 7 is an exploded perspective view illustrating a liquid crystal display device including a light emitting device package according to a second embodiment.

FIG. 7 is an exploded perspective view illustrating a liquid crystal display device including a light emitting device package according to a second embodiment.

Here, the same elements as described previously with reference to FIG. 6 will not be repeated.

FIG. 7 illustrates a direct-light type liquid crystal display apparatus 500. The liquid crystal display apparatus 500 may include a liquid crystal display panel 510 and a backlight unit 570 to supply light to the liquid crystal display panel 510.

The liquid crystal display panel 510 has been previously described above with reference to FIG. 6, and thus a description thereof will not be given.

The backlight unit 570 may include a plurality of light emitting device modules 523, a reflection sheet 524, a lower chassis 530 in which the light emitting device module 523 and the reflection sheet 524 are installed, a diffusion plate 540 disposed above the light emitting device module 523, and a plurality of optical films 560.

The light emitting device module 523 may include a plurality of light emitting device packages 522 and a PCB 521 on which the plurality of light emitting device packages 522 are mounted to form an array.

The reflection sheet 524 reflects light emitted from the light emitting device packages 522 toward the liquid crystal display panel 510 to improve efficiency of light utilization.

Meanwhile, light emitted from the light emitting device module 523 is incident upon the diffusion plate 540, and the optical films 560 are disposed on the diffusion plate 540. The optical films 560 may include a diffusion film 566, a prism film 550, and a protective film 564.

In this regard, the lighting apparatus 300 and the liquid crystal display apparatuses 400 and 500 may be included in a lighting system, and other apparatuses for lighting including the light emitting device package may also be included in the lighting system.

As is apparent from the above description, in the light emitting device package according to an embodiment, the optical density (absorbance) of the silane group (Si—H) that is not reacted with the vinyl group (—CH=CH$_2$) is adjusted in the range of 0.002 to 0.01 (arb. unit) contained in the resin material, such that binding density therebetween during shrinkage and swelling of the resin material is increased while the light emitting device emits light. Thus, binding between the unreacted silane group (Si—H) and external foreign materials is reduced, and corrosion of the surface of the lead frame electrically connected to the light emitting device is reduced, resulting in improved reliability.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A resin material comprising:
   a main material having a vinyl group (—CH=CH$_2$); and
   a sub-material having a plurality of silane groups (Si—H); and
   a catalyst that promotes binding between the vinyl groups and the silane groups,
   wherein a content of the plurality of silane groups is within 0.7 to 0.9 times a content of the vinyl group,
   wherein an optical density (absorbance) of a Fourier transform infrared spectroscopy (FT-IR) signal for silane groups (Si—H) not reacted with the vinyl groups (—CH=CH$_2$) is in the range of 0.0002 to 0.004 (arb. unit) in a first wavenumber range, and the optical density is in the range of 0.005 to 0.01 (arb unit) in a second wavenumber range different from the first wavenumber range,
   wherein the first wavenumber range is in the range of 2100 to 2200 cm$^{-1}$, and
   wherein the second wavenumber range is in the range of 870 to 930 cm$^{-1}$.

2. The resin material according to claim 1,
   wherein the catalyst is platinum (Pt).

3. A light emitting device package comprising:
   a light source unit;
   a body comprising first and second lead frames electrically connected to the light source unit and having a cavity formed on the first and second lead frames; and a resin material disposed in the cavity wherein the resin material includes a main material having a vinyl group (—CH=CH$_2$) a sub-material having a plurality of silane groups (Si—H) and a catalyst that promotes binding between the vinyl groups and the silane groups, wherein the content of the plurality of silane groups is within 0.7 to 0.9 times a content of the vinyl group, wherein an optical density (absorbance) of a Fourier transform infrared spectroscopy (FT-IR) signal for silane groups (Si—H) not reacted with the vinyl groups (—CH=CH$_2$) is in the range of 0.0002 to 0.004 (arb. unit) in a first wavenumber range, and the optical density is in the range of 0.005 to 0.01 (arb. unit) in a second wavenumber range different from the first wavenumber range, wherein the first wavenumber range is in the range of 2100 to 2200 cm$^{-1}$, and wherein the second wavenumber range is in the range of 870 to 930 cm$^{-1}$.

4. The light emitting device package according to claim 3, wherein the resin material comprises an organic polysiloxane or polysiloxane.

5. The light emitting device package according to claim 3, wherein the resin material is formed to have a multi layer structure.

* * * * *